(12) United States Patent
Motoshima

(10) Patent No.: US 11,577,357 B2
(45) Date of Patent: Feb. 14, 2023

(54) TEMPERATURE ADJUSTING DEVICE AND POLISHING DEVICE

(71) Applicant: EBARA CORPORATION, Tokyo (JP)

(72) Inventor: Yasuyuki Motoshima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 539 days.

(21) Appl. No.: 16/692,710

(22) Filed: Nov. 22, 2019

(65) Prior Publication Data

US 2020/0164480 A1 May 28, 2020

(30) Foreign Application Priority Data

Nov. 28, 2018 (JP) .............................. JP2018-222266

(51) Int. Cl.
*B24B 49/00* (2012.01)
*B24B 37/015* (2012.01)
*H01L 21/304* (2006.01)

(52) U.S. Cl.
CPC .......... *B24B 37/015* (2013.01); *H01L 21/304* (2013.01)

(58) Field of Classification Search
CPC ............................ B24B 37/015; H01L 21/304
USPC ........................................ 451/7, 41, 53, 287
See application file for complete search history.

(56) References Cited

U.S. PATENT DOCUMENTS

| | | | |
|---|---|---|---|
| 7,837,534 B2 * | 11/2010 | Aiyoshizawa | B24B 55/02 451/7 |
| 9,782,870 B2 * | 10/2017 | Maruyama | G01J 5/025 |
| 10,099,340 B2 * | 10/2018 | Motoshima | B24B 49/14 |
| 2011/0159782 A1 | 6/2011 | Sone et al. | |
| 2012/0220196 A1 | 8/2012 | Maruyama et al. | |
| 2020/0039031 A1 * | 2/2020 | Chen | B24B 37/015 |

FOREIGN PATENT DOCUMENTS

| | | |
|---|---|---|
| JP | 4902433 B2 | 3/2012 |
| JP | 2012-176449 A | 9/2012 |
| JP | 2017-148933 A | 8/2017 |

* cited by examiner

*Primary Examiner* — Joseph J Hail
*Assistant Examiner* — Shantese L Mcdonald
(74) *Attorney, Agent, or Firm* — BakerHostetler

(57) ABSTRACT

An object of the present invention is to improve in-plane uniformity in polishing in a polishing device.
A temperature adjusting device for adjusting temperature of a rotating polishing pad comprises: a heat conductor that can contact with a top face of the polishing pad; an arm for holding the heat conductor above the polishing pad; column members formed to stand on a top face of the heat conductor, comprising an upstream-side column member and a downstream-side column member arranged at a position at an upstream/downstream side of rotation of the polishing pad; and overhung members extending, from the upstream-side column member and the downstream-side column member, in directions that are parallel to the top face of the heat conductor; wherein the overhung members can contact with a top face of the arm.

14 Claims, 9 Drawing Sheets

TEMPERATURE ADJUSTING DEVICE AND POLISHING DEVICE

TECHNICAL FIELD

The present invention relates to a temperature adjusting device for adjusting temperature of a polishing device and a polishing pad in the polishing device.

BACKGROUND ART

Conventionally, in a polishing device for polishing a to-be-polished object, for example, a semiconductor wafer, a temperature adjusting device for adjusting temperature of a polishing pad is used. The temperature adjusting device comprises a heat conductor which is constructed to be able to cool or heat the polishing pad, wherein the temperature of the polishing pad is adjusted by supporting the heat conductor by an arm and bringing the heat conductor in contact with the polishing pad (for example, refer to Patent Literatures 1 and 2).

CITATION LIST

Patent Literature

PTL 1: Japanese Patent Application Public Disclosure No. 2017-148933
PTL 2: Japanese Patent Publication No. 4902433

SUMMARY OF INVENTION

Technical Problem

In the case that a heat conductor is rigidly fixed to an arm, there is a risk that the heat conductor may be pushed, with excessive force, against a polishing pad; and, in such a case, there arises a problem that flow of a polishing liquid on the polishing pad is obstructed by the heat conductor, and, as a result, in-plane uniformity of a polishing rate is lowered.

The present invention has been made by taking the above matters into consideration; and an object of the present invention is to improve in-plane uniformity in polishing in a polishing device.

Solution to Problem

According to a first mode of the present invention, a temperature adjusting device for adjusting temperature of a rotating polishing pad is provided, wherein the temperature adjusting device comprises: a heat conductor which can be brought in contact with a top face of the polishing pad; an arm that holds the heat conductor above the polishing pad; column members which are formed to stand on a top face of the heat conductor, and comprise an upstream-side column member and a downstream-side column member arranged at a position at an upstream side and a position at a downstream side of rotation of the polishing pad, respectively; and overhung members which extend, from the upstream-side column member and the downstream-side column member, in directions that are parallel to the top face of the heat conductor; wherein the overhung members can be brought in contact with a top face of the arm.

According to the temperature adjusting device in the above mode, the overhung members connected to the upstream-side column member and the downstream-side column member are moved apart from the arm, when the arm is moved downward to bring the heat conductor in contact with the polishing pad. Accordingly, it becomes possible to bring the heat conductor in contact with the surface of the polishing pad by using the weight of the heat conductor itself, i.e., without pushing the heat conductor against the polishing pad by excessive force applied by the arm. Thus, it becomes possible to prevent or suppress obstruction, by the heat conductor, of flow of a polishing fluid on the surface of the polishing pad, and, as a result, in-plane uniformity in polishing of a to-be-polished object can be improved. Further, when the heat conductor is pulled away from the polishing pad by moving the arm upward, the arm is brought in contact with the overhung members, so that the heat conductor can be lifted.

According to a second mode of the present invention, the mode comprises the first mode, wherein, when the heat conductor is in contact with the polishing pad, the overhung members are separated from the arm.

According to the temperature adjusting device in the above mode, the heat conductor can be brought in contact with the surface of the polishing pad by using the weight of the heat conductor itself, i.e., without pushing the heat conductor against the polishing pad by excessive force applied by the arm.

According to a third mode of the present invention, the mode comprises the second mode, wherein, when the arm is brought in contact with the overhung members, the heat conductor is separated from the polishing pad.

According to the temperature adjusting device in the above mode, the heat conductor can be lifted from the polishing pad as a result that the arm is brought in contact with the overhung members.

According to a fourth mode of the present invention, the mode comprises one of the first to third modes, wherein the upstream-side column member can be brought in contact with one of a first side face and a second side face of the arm, the downstream-side column member can be brought in contact with the other of the first side face and the second side face of the arm, the first side face is a face which is made to face the upstream side of the rotation, and the second side face is a face which is made to face the downstream side of the rotation.

According to the temperature adjusting device in the above mode, relative movement between the heat conductor and the arm in a plane parallel to the polishing pad can be regulated to that within a predetermined range, as a result that the upstream-side column member and the downstream-side column member are brought in contact with the first side face and the second side face of the arm. Thus, the position of the heat conductor on the polishing pad can be maintained in a position near a predetermined position.

According to a fifth mode of the present invention, the mode comprises the fourth mode, wherein at least one of the upstream-side column member and the downstream-side column member can be brought in contact with a third side face of the arm, at least one of the upstream-side column member and the downstream-side column member can be brought in contact with a fourth side face of the arm, the third side face is a face which is made to face an inner periphery side in a radial direction in the polishing pad, and the fourth side face is a face which is made to face an outer periphery side in the radial direction in the polishing pad.

According to the temperature adjusting device in the above mode, relative movement between the heat conductor and the arm in a plane parallel to the polishing pad can be regulated to that within a predetermined range, as a result that the upstream-side column member and the downstream-side column member are brought in contact with the third side face and the fourth side face of the arm. Thus, the position of the heat conductor on the polishing pad can be maintained in a position near a predetermined position.

According to a sixth mode of the present invention, the mode comprises the fourth or fifth mode, wherein the upstream-side column member and the downstream-side column member regulate relative movement between the heat conductor and the arm in a direction parallel to the top face of the heat conductor.

According to the temperature adjusting device in the above mode, the position of the heat conductor on the polishing pad can be maintained in a position near a predetermined position.

According to a seventh mode of the present invention, the mode comprises one of the first to sixth modes, wherein a part, which is brought in contact with the overhung member, in the arm comprises an elastic member.

According to the temperature adjusting device in the above mode, impact at the time of contacting between the overhung members and the arm, when the heat conductor is lifted from the polishing pad, can be mitigated.

According to a eighth mode of the present invention, the mode comprises one of the fourth to seventh modes, wherein a part, which is brought in contact with the upstream-side column member or the downstream-side column member, in the arm comprises an elastic member.

According to the temperature adjusting device in the above mode, impact at the time of contacting between the arm and the upstream-side column member and the downstream-side column member can be mitigated.

According to a ninth mode of the present invention, the mode comprises one of the first to eighth modes, wherein the overhung member extends in a radial direction in the polishing pad.

According to the temperature adjusting device in the above mode, the arm can hold the heat conductor via the overhung members.

According to a tenth mode of the present invention, the mode comprises one of the first to ninth modes, wherein, when the heat conductor is in contact with the polishing pad, a space, in a height direction, between the overhung member relating to the upstream-side column member and the arm is different from a space, in a height direction, between the overhung member relating to the downstream-side column member and the arm.

According to the temperature adjusting device in the above mode, the arm is first brought in contact with the overhung member relating to one of the upstream-side column member and the downstream-side column member, when the arm is moved upward for separating the heat conductor from the polishing pad; thus, the heat conductor can be torn off from the polishing pad by applying relatively small force, compared with the case that the whole body of the heat conductor is evenly lifted.

According to an eleventh mode of the present invention, the mode comprises the tenth mode, wherein, when the heat conductor is in contact with the polishing pad, a space, in a height direction, between the overhung member relating to the upstream-side column member and the arm is smaller than a space, in a height direction, between the overhung member relating to the downstream-side column member and the arm.

According to the temperature adjusting device in the above mode, the arm is first brought in contact with the overhung member relating to the upstream-side column member, when the arm is moved upward for separating the heat conductor from the polishing pad; thus, the heat conductor can be torn off from the polishing pad by applying relatively small force, compared with the case that the whole body of the heat conductor is evenly lifted. Further, since a polishing liquid easily enters, from an upstream side of the polishing pad, a space between the heat conductor and the polishing pad, the force required to tear off the heat conductor from the polishing pad can be further reduced.

According to a twelfth mode of the present invention, the mode comprises the eleventh mode, wherein a diameter of the upstream-side column member is larger than a diameter of the downstream-side column member.

According to the temperature adjusting device in the above mode, at the moment that the heat conductor is torn off from the polishing pad as a result that the arm is brought in contact with the overhung member relating to the upstream-side column member, force larger than that applied after the heat conductor is torn off is temporarily applied to the upstream-side column member; still, it is possible to accept the force by the thick upstream-side column member.

According to a thirteenth mode of the present invention, the mode comprises one of the first to twelfth modes, wherein the upstream-side column member and the downstream-side column member are positioned around the arm.

According to the temperature adjusting device in the above mode, relative movement between the heat conductor and the arm in a plane parallel to the polishing pad can be regulated to that within a predetermined range, so that the position of the heat conductor on the polishing pad can be maintained in a position near a predetermined position.

According to a fourteenth mode of the present invention, the mode comprises one of the first to twelfth modes, wherein the upstream-side column member and the downstream-side column member are positioned in through holes formed in the arm.

According to the temperature adjusting device in the above mode, relative movement between the heat conductor and the arm in a plane parallel to the polishing pad can be regulated to that within a predetermined range, so that the position of the heat conductor on the polishing pad can be maintained in a position near a predetermined position.

According to a fifteenth mode of the present invention, the mode comprises one of the first to fourteenth modes, wherein the temperature adjusting device further comprises a movable mechanism for moving the heat conductor upward and downward.

According to the temperature adjusting device in the above mode, the heat conductor can be brought in contact with the polishing pad by moving the heat conductor downward, and the heat conductor can be separated from the polishing pad by lifting the heat conductor upward.

According to a sixteenth mode of the present invention, the mode comprises the fifteenth mode, wherein the movable mechanism can move the heat conductor in a horizontal direction.

According to the temperature adjusting device in the above mode, the heat conductor can be torn off from the polishing pad by applying less force.

According to a seventeenth mode of the present invention, a polishing device is provided; wherein the polishing device comprises the polishing pad, a holding mechanism for holding a to-be-polished object on the polishing pad, and the temperature adjusting device in one of the first to sixteenth modes.

According to the polishing device in the above mode, in-plane uniformity in polishing of the to-be-polished object can be improved.

DESCRIPTION OF EMBODIMENTS

In the following description, embodiments of the present invention will be explained with reference to the figures.

First Embodiment

Figure 1:
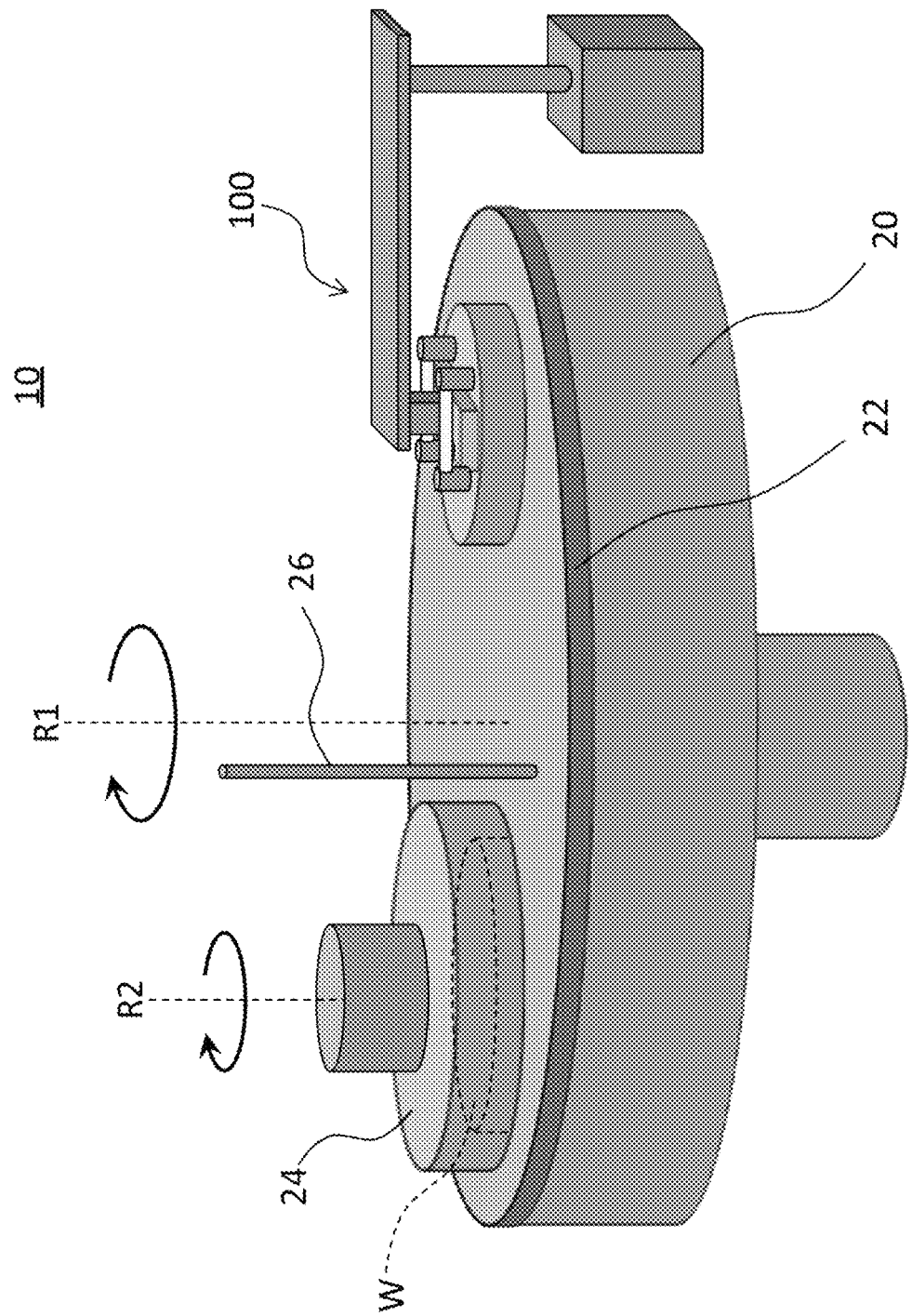
FIG. 1 is a perspective view showing a schematic construction of a polishing device to which a temperature adjusting device according to a first embodiment of the present invention is applied.

FIG. 1 is a perspective view showing a schematic construction of a polishing device to which a temperature adjusting device according to a first embodiment of the present invention is applied. A polishing device 10 comprises a polishing table 20, a polishing pad 22, a top ring 24, a polishing liquid supplying nozzle 26, and a temperature adjusting device 100. The polishing table 20 holds, on its top face, the polishing pad 22, and makes the polishing pad 22 to be rotated about an axis of rotation R1 at a predetermined number of rotations. The top ring 24 brings a to-be-polished object (for example, a semiconductor wafer W) in contact with a surface of the polishing pad 22 and holds it, and makes the to-be-polished object to be rotated about an axis of rotation R2 at a predetermined number of rotations. The polishing liquid supplying nozzle 26 supplies a polishing liquid (for example, slurry) to the surface of the polishing pad 22 at a predetermined rate. The temperature adjusting device 100 is brought in contact with the polishing pad 22 to adjust temperature of the polishing pad 22.

In the polishing device 10 having the above construction, the to-be-polished object is rotated by the top ring 24, and pushed against the polishing pad 22 which is rotated about the axis of rotation different from the axis of rotation of the top ring 24. The polishing liquid exists, in a thinly spread manner, between a to-be-polished face of the to-be-polished object and the surface of the polishing pad 22; and the to-be-polished object is rubbed, while touching the polishing liquid, against the polishing pad 22. In this manner, i.e., by making the polishing liquid exist and rubbing the to-be-polished object against the polishing pad 22, the to-be-polished object is chemically and mechanically polished.

Figure 2:
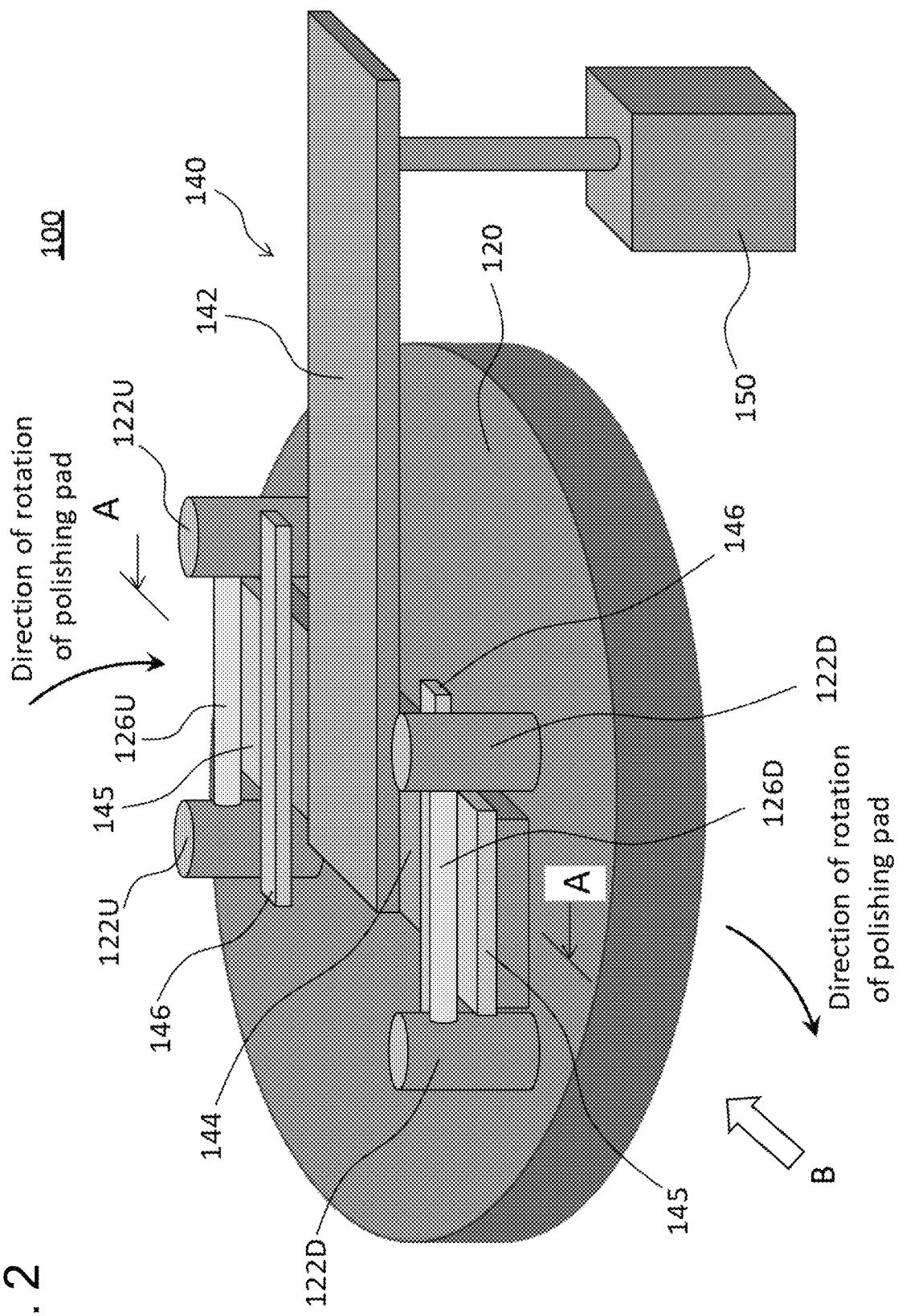
FIG. 2 is a perspective view of the temperature adjusting device according to the first embodiment.
Figure 3:
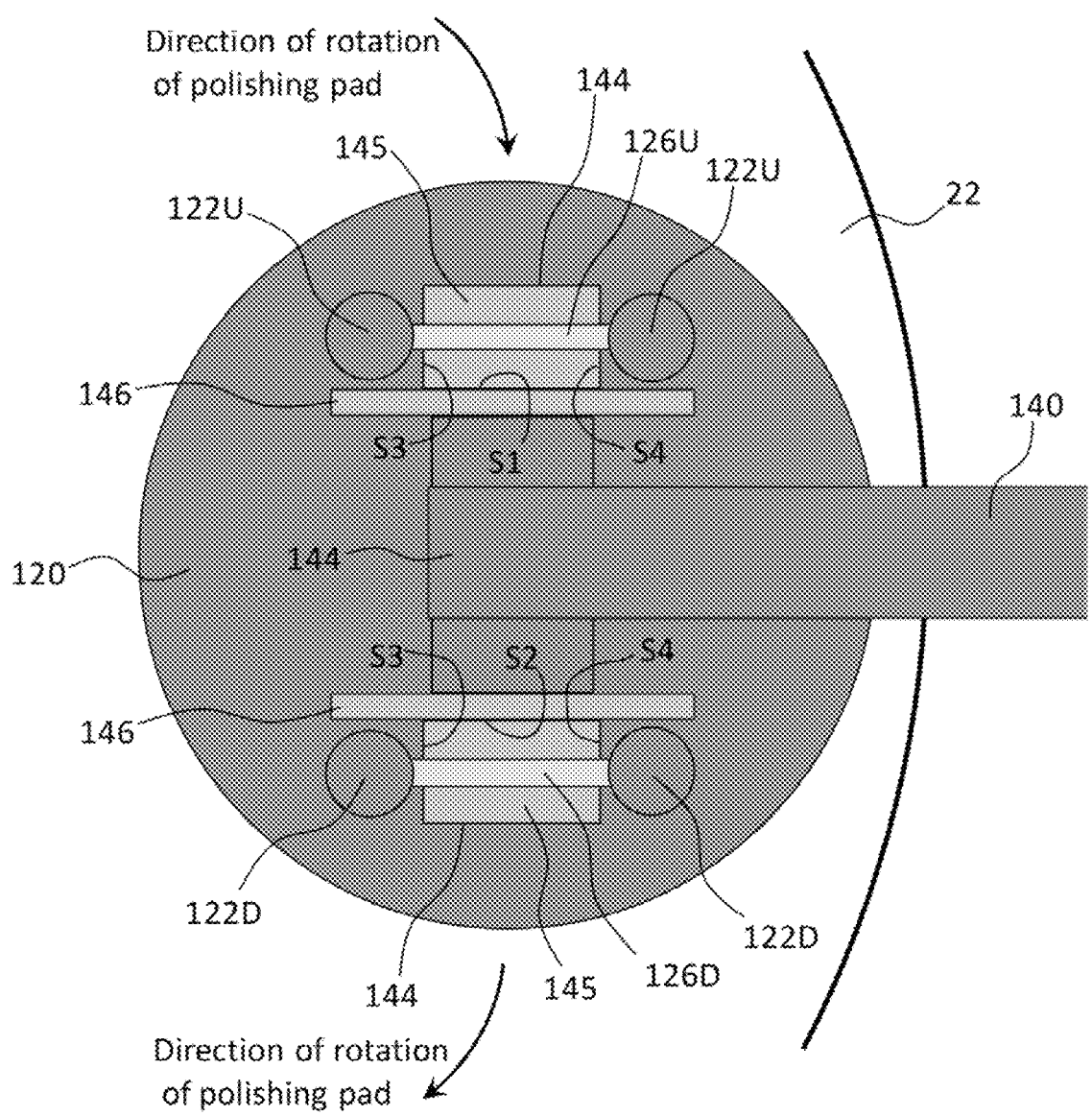
FIG. 3 is a top view of the temperature adjusting device, viewed from above thereof, according to the first embodiment.
Figure 4:
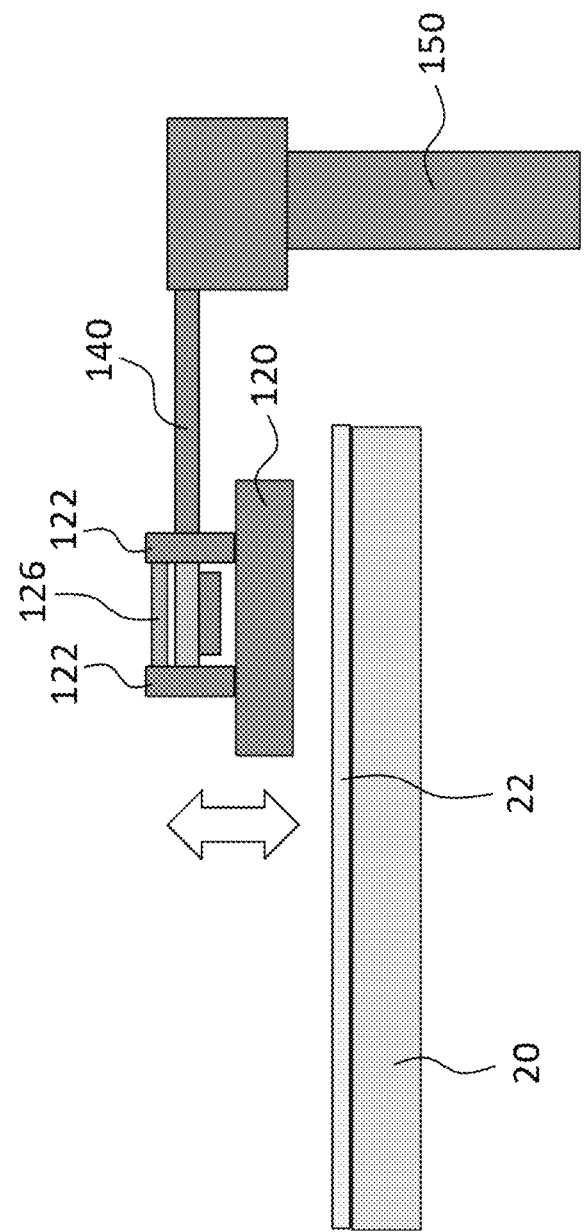
FIG. 4 is a side view of the temperature adjusting device, viewed from the direction indicated by an arrow B shown in FIG. 2, according to the first embodiment.
Figure 5:
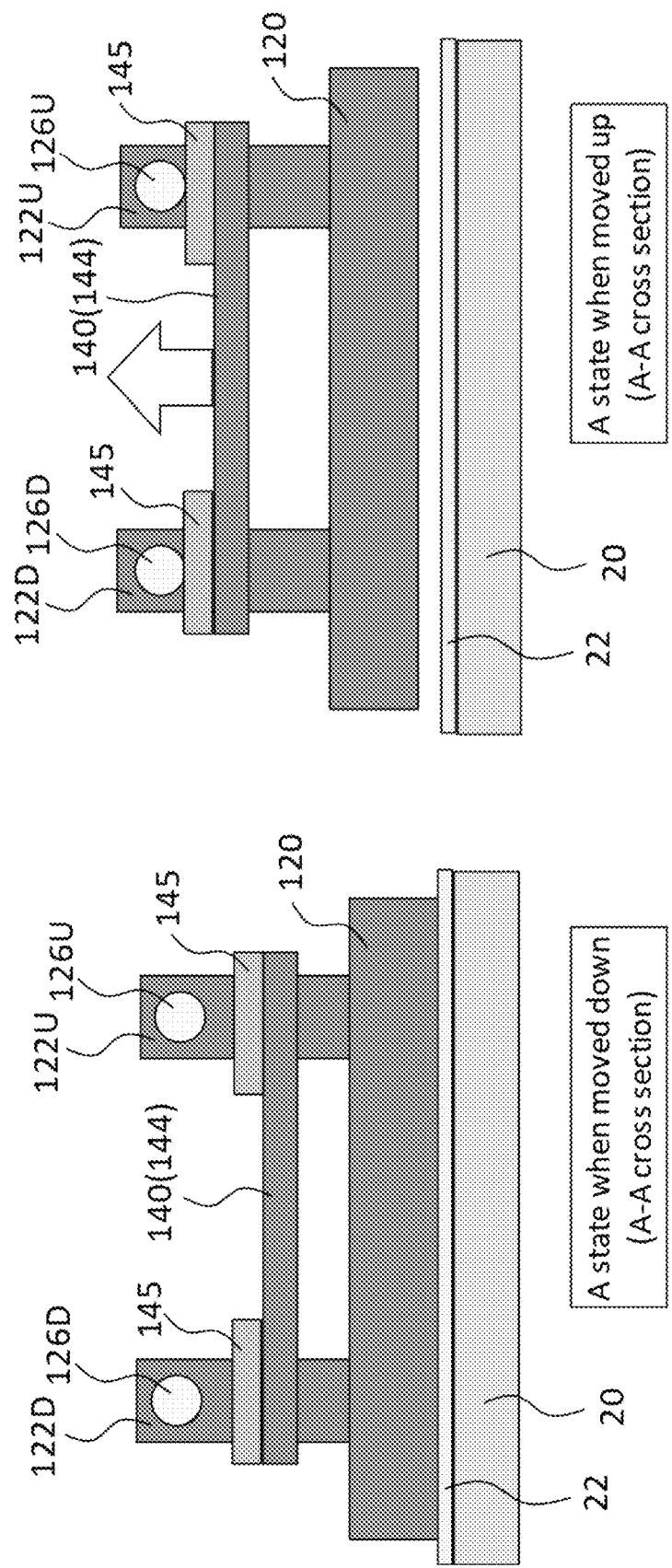
FIG. 5 is a figure showing a cross section of the temperature adjusting device, along the A-A line shown in FIG. 2, according to the first embodiment.

Next, a detailed construction of the temperature adjusting device 100 will be explained with reference to FIG. 2 to FIG. 5. FIG. 2 is a perspective view of the temperature adjusting device 100 according to the first embodiment. FIG. 3 is a top view of the temperature adjusting device 100 viewed from above thereof. FIG. 4 is a side view of the temperature adjusting device 100 viewed from the direction indicated by an arrow 8 shown in FIG. 2. FIG. 5 is a figure showing a cross section of the temperature adjusting device 100 along the A-A line shown in FIG. 2.

The temperature adjusting device 100 comprises a heat conductor 120, an arm 140, and an ascending/descending cylinder 150. The arm 140 comprises an arm base part 142 and an arm tip part 144. One end of the arm base part 142 is connected to the ascending/descending cylinder 150. The arm tip part 144 is attached to the other end of the arm base part 142. The heat conductor 120 is engaged with the arm tip part 144 by a structure which will be explained later. As shown in FIG. 4, by performing ascending/descending action by the ascending/descending cylinder 150, the heat conductor 120 can be moved downward to bring it in contact with the polishing pad 22, and the heat conductor 120 can be lifted up to separate it from the polishing pad 22.

The heat conductor 120 is constructed to adjust temperature of the polishing pad 22 by cooling or heating the polishing pad 22, when the heat conductor 120 is in contact with the polishing pad 22. For example, the heat conductor 120 comprises therein a cooling liquid flow path and a heating liquid flow path (they are not shown in the figures). A temperature-adjusted cooling liquid (for example, cold water) is supplied from an external pipe to the cooling liquid flow path, and temperature-adjusted heating liquid (for example, warm water) is supplied from an external pipe to the heating liquid flow path.

Plural column members 122 are formed in such a manner that they stand on the top face of the heat conductor 120. The column members 122 comprise upstream-side column members 122U and downstream-side column members 122D. As shown in FIG. 3, the upstream-side column members 122U are arranged at positions close to an upstream side of rotation of the polishing pad 22, and the downstream-side column members 122D are arranged at positions close to a downstream side of the rotation of the polishing pad 22. In the example shown in FIGS. 2 and 3, two each of the upstream-side column members 122U and the downstream-side column members 122D are constructed. Each of the two upstream-side column members 122U is positioned opposite to the other, and the arm tip part 144 is positioned between them; and the two upstream-side column members 122U are connected to each other by a overhung member 126U which extends, in a direction that is horizontal and along the arm base part 142, across the arm tip part 144. Similarly, each of the two downstream-side column members 122D is positioned opposite to the other, and the arm tip part 144 is positioned between them; and the two downstream-side column members 122D are connected to each other by a overhung member 126D which extends, in a direction that is horizontal and along the arm base part 142, across the arm tip part 144.

In the arm tip part 144, the parts below the overhung members 126U and 126D are constructed by use of elastic members 145 (for example, resin). Additionally, the elastic members 145, at their sides positioned closer to the arm base part 142 than the upstream-side column members 122D and the downstream-side column members 122D, are elongated in parallel to the overhung members 126U and 126D to form guide parts 146, respectively. In this regard, it may be possible to construct the guide parts 146 in positions at far sides of the upstream-side column members 122D and the downstream-side column members 122D that are distant from the arm base part 142.

As shown in FIG. 5, when the arm 140 is moved downward to bring the heat conductor 120 in contact with the polishing pad 22, the overhung member 126U connected to the upstream-side column members 122U and the overhung member 126D connected to the downstream-side column members 122D are separated from the elastic members 145 which are parts of the top face of the arm 140 (the arm tip part 144). Also, the arm 140 is separated from the top face of the heat conductor 120. Accordingly, the heat conductor 120 is brought in contact with the surface of the polishing pad 22 by using the weight of the heat conductor 120 itself, i.e., without pushing the heat conductor 120 against the polishing pad 22 by excessive force applied by the arm 140. On the other hand, when the arm 140 is moved upward to pull the heat conductor 120 away from the polishing pad 22, the elastic members 145 which are parts of the top face of the arm 140 (the arm tip part 144) are brought in contact with the overhung members 126U and 126D and the heat conductor 120 is lifted thereby.

As explained above, the heat conductor 120 is put on the polishing pad 22 by applying the weight of the heat conductor 120 itself; thus, it becomes possible to prevent or suppress obstruction, by the heat conductor 120, of flow of a polishing fluid on the surface of the polishing pad 22. Accordingly, the polishing liquid is spread uniformly on the surface of the polishing pad 22, and, as a result, in-plane uniformity in polishing of the to-be-polished object, which is held by the top ring 24 and polished, can be improved. Further, for example, at the time of maintenance or the like, the heat conductor 120 can be lifted from the polishing pad 22, by moving the arm 140 upward by the ascending/descending cylinder 150. Since the parts of the arm 140 (the arm tip part 144) which are to be in contact with the overhung members 126U and 126D comprise the elastic members 145, impact at the time of contacting between the overhung members 126U and 126D and the arm 140 (the arm tip part 144), when the heat conductor 120 is lifted, can be mitigated.

According to FIG. 3 that is next referred to, relative movement between the heat conductor 120 and the arm 140 in a plane parallel to the polishing pad 22 is regulated to that within a predetermined range, as a result that the upstream-side column member 122U and the downstream-side column member 122D are brought in contact with the arm tip part 144. FIG. 3 shows a state that none of the upstream-side column members 122U and the downstream-side column members 122D is in contact with the arm tip part 144. In this regard, for example, when the heat conductor 120 attempts to move, with rotating operation of the polishing pad 22, in a direction that is the same as the direction of movement of the polishing pad 22 (that is, a downward direction in FIG. 3, that is the direction toward the downstream side of rotation), the upstream-side column members 122U hit a first side face S1 (the face facing the upstream side) of the guide part 146 positioned at the upstream side of the arm tip part 144. Thus, the heat conductor 120 cannot move further toward the downstream side.

Similarly, when the heat conductor 120 attempts to move toward the upstream side (an upward direction in FIG. 3), the downstream-side column members 122D hit a second side face S2 (the face facing the downstream side) of the guide part 146 positioned at the downstream side of the arm tip part 144, so that the heat conductor 120 cannot move further toward the upstream side. Further, when the heat conductor 120 attempts to move toward an outer periphery side of the polishing pad 22 (a right direction in FIG. 3), column members, which are positioned at the side close to the center of the polishing pad 22 (the left side in FIG. 3), in the upstream-side column members 122U and the downstream-side column members 122D hit third side faces S3 (the faces facing the center side of the polishing pad 22) of the elastic members 145 of the arm tip part 144, so that the heat conductor 120 cannot move further to approach the outer periphery of the polishing pad 22. Further, when the heat conductor 120 attempts to move toward the center side of the polishing pad 22 (a left direction in FIG. 3), column members, which are positioned at the side close to the outer periphery of the polishing pad 22 (the right side in FIG. 3), in the upstream-side column members 122U and the downstream-side column members 122D hit fourth side faces S4 (the faces facing the outer periphery side of the polishing pad 22) of the elastic members 145 of the arm tip part 144, so that the heat conductor 120 cannot move further to approach the center of the polishing pad 22.

As explained above, the position of the heat conductor 120 on the polishing pad 22 can be maintained in a position near a predetermined position that is determined according to the position of the arm 140.

Figure 6:
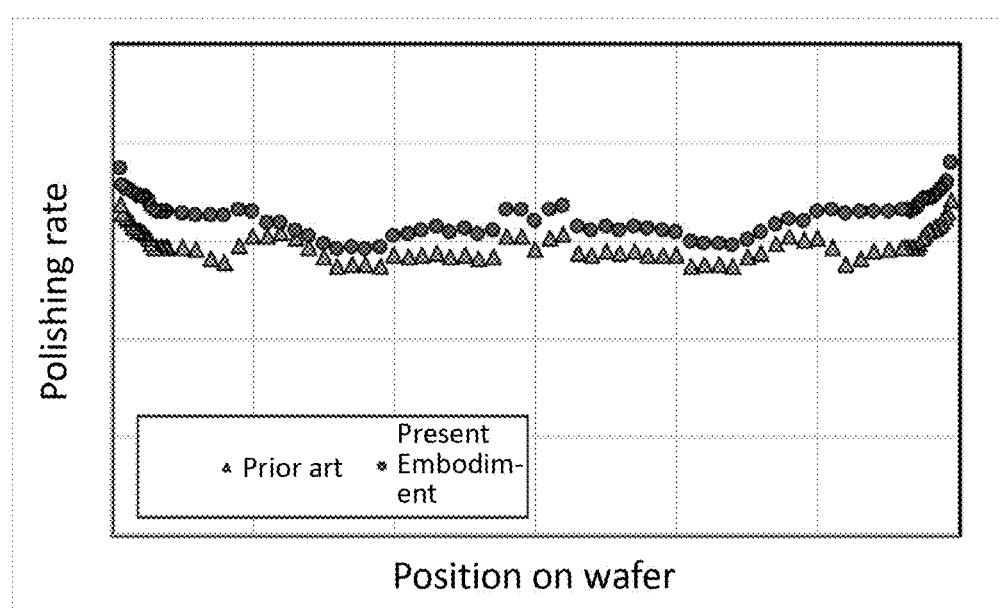
FIG. 6 is a graph showing examples of in-plane uniformity of polishing rates.

FIG. 6 is a graph showing an example of in-plane uniformity of a polishing rate in the polishing device 10 which adopts the temperature adjusting device 100 according to the present embodiment, and that of a polishing device which adopts a conventional temperature adjusting device. The horizontal axis represents distance from a center of a semiconductor wafer which is a to-be-polished object, wherein the middle of the horizontal axis corresponds to the center of the semiconductor wafer, and the both ends of the horizontal axis correspond to parts of the outer periphery of the semiconductor wafer. The vertical axis represents a polishing rate. In a conventional polishing device, the polishing rates decrease at parts positioned slightly inward from the outer periphery of the semiconductor wafer (the parts pointed by an arrow). This has occurred because the polishing liquid was partly pushed aside as a result that the conventional temperature adjusting device was pushed, with excessive force, against a polishing pad. On the other hand, it can be understood that, in the case of the polishing device 10 according to the present embodiment, decrease in the polishing rates at the parts positioned slightly inward from the outer periphery of the semiconductor wafer is suppressed, and the in-plane uniformity of the polishing rate is improved.

Second Embodiment

Figure 7:
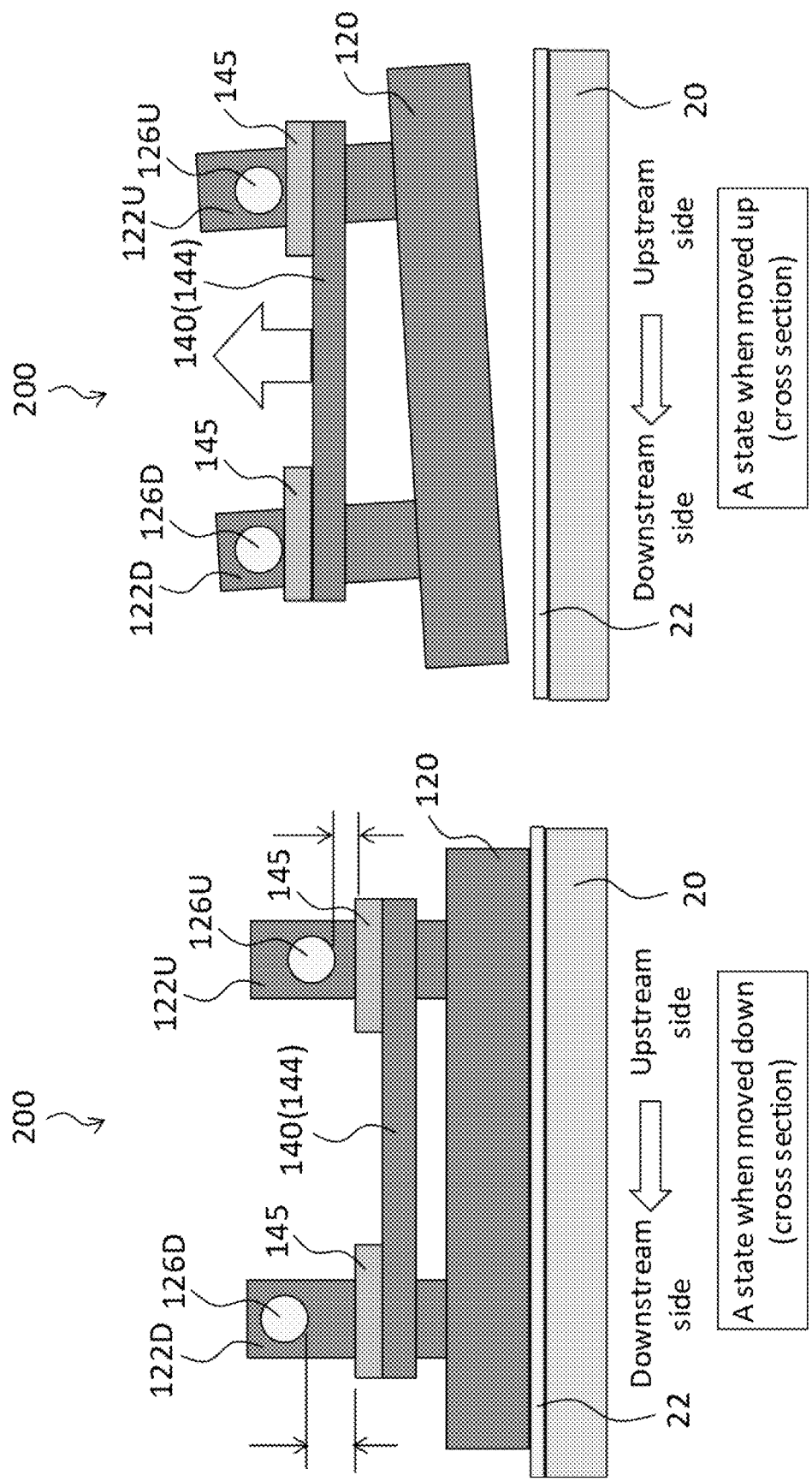
FIG. 7 is a figure showing a construction of a temperature adjusting device according to a second embodiment of the present invention.

FIG. 7 is a figure showing a construction of a temperature adjusting device 200 according to a second embodiment of the present invention. The temperature adjusting device 200 comprises a construction similar to the construction of the temperature adjusting device 100 according to the first embodiment, except for the structure shown in FIG. 7. FIG. 7 shows a cross section of the temperature adjusting device 200, in a manner similar to that in FIG. 5 in the first embodiment.

In the temperature adjusting device 200, the overhung members 126U and 126D are positioned in such a manner that a height from the top face of the heat conductor 120 to one of the overhung members 126U and 126D is different from that to the other of the overhung members 126U and 126D. In the example shown in FIG. 7, the height from the top face of the heat conductor 120 to the overhung member 126U is lower than the height from the top face of the heat conductor 120 to the overhung member 126D. Accordingly, when the arm 140 is moved upward for separating the heat conductor 120 from the polishing pad 22, the arm 140 (the elastic member 145 of the arm tip part 144) first comes in contact with the overhung member 126U relating to the upstream-side column members 122U, and, as a result, uneven upward force is applied to part, near the overhung member 126U, of the heat conductor 120. As a result that such uneven force is applied to one side of the heat conductor 120, the heat conductor 120 can be torn off from the polishing pad 22 by applying relatively small force, compared with the case that the whole body of the heat conductor 120 is evenly lifted. Further, since a polishing liquid easily enters, from the upstream side of the polishing pad 22, a space between the heat conductor 120 and the polishing pad 22, the force required to tear off the heat conductor 120 from the polishing pad 22 can be further reduced.

Figure 8:
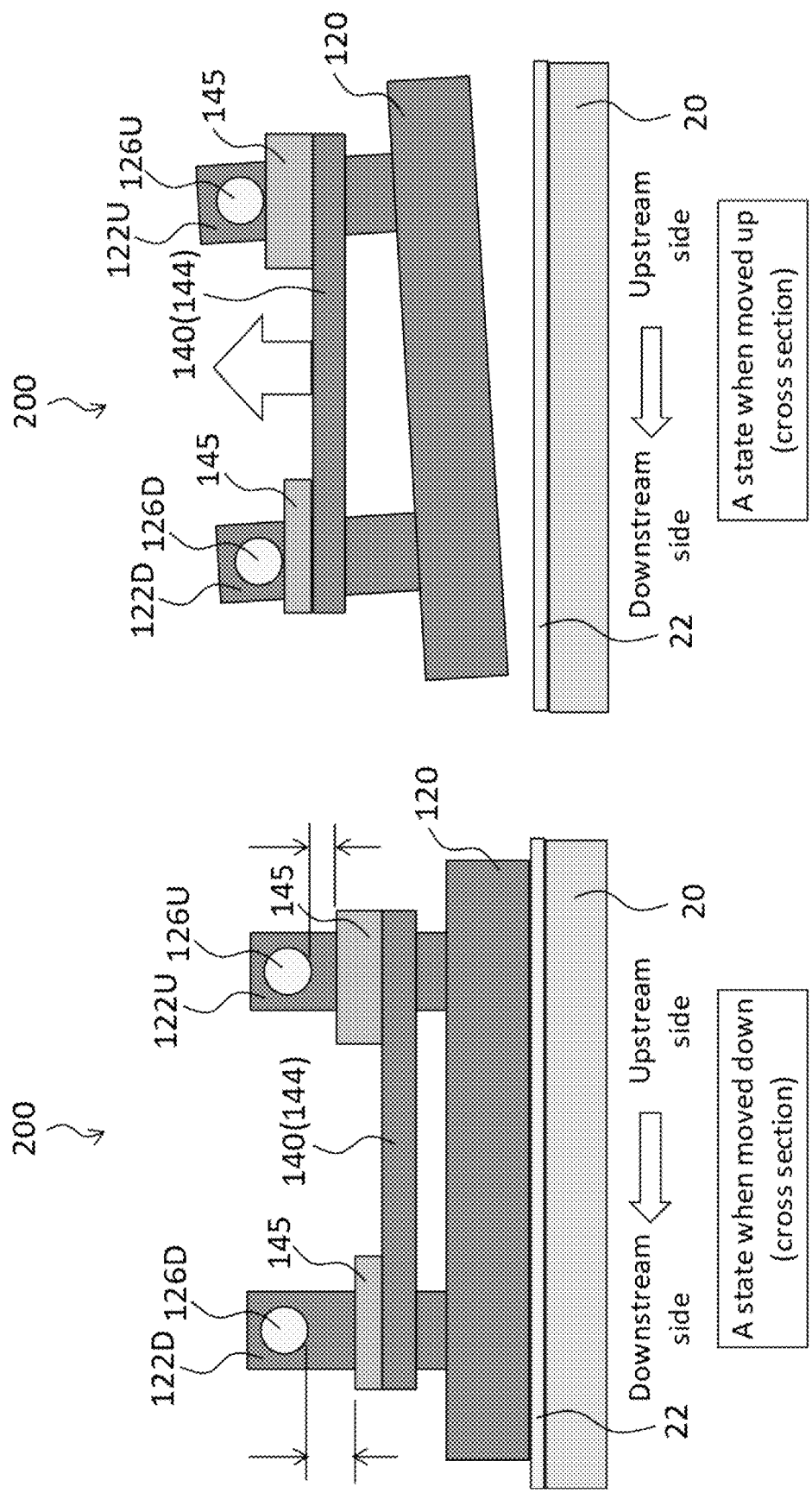
FIG. 8 is a figure showing a construction of a modified example of a temperature adjusting device according to the second embodiment.

FIG. 8 is a figure showing a construction of a modified example of the temperature adjusting device 200. In the construction shown in FIG. 8, although a height from the top face of the heat conductor 120 to one of the overhung members 126U and 126D is the same as that to the other of the overhung members 126U and 126D, a thickness of the elastic member 145 positioned at the side of the upstream-side column members 122U is thicker than a thickness of the elastic member 145 positioned at the side of the downstream-side column members 122D. In this construction, the arm 140 (the elastic member 145) also first comes in contact with the overhung member 126U at the side of the upstream-side column members 122U when the arm 140 is moved upward, so that effect similar to that obtainable in the case of the construction shown in FIG. 7 can be obtained.

In the temperature adjusting device 200 shown in each of FIG. 7 and FIG. 8, when the arm 140 is further moved upward after the arm 140 is brought in contact with the overhung member 126U relating to the upstream-side column members 122U, the upstream side of the heat conductor 120 is lifted and the heat conductor 120 leans thereby, and, thereafter, the arm 140 (elastic member 145) is brought in contact with the overhung member 126D relating to the downstream-side column members 122D. Thereafter, the heat conductor 120 is supported by the overhung members 126U and 126D at two positions at the upstream side and the downstream side, respectively; and, by further moving the arm 140 upward, the heat conductor 120 is completely separated from the polishing pad 22 and brought into a state that the heat conductor 120 is hung by the arm 140 (refer to the figure on the right side in each of FIGS. 7 and 8).

At the moment that the heat conductor 120 is torn off from the polishing pad 22 as a result that the upstream side of the arm 140 is brought in contact with the overhung member 126U, force larger than that applied after tearing off of the heat conductor, i.e., at the time that the heat conductor 120 is leaning (note that the above force is smaller than that applied in the case that the whole body of the heat conductor 120 is evenly lifted to tear it off from the polishing pad 22) is temporarily applied to the upstream-side column member 122U. On the other hand, large force that is applied at the moment of tearing off does not apply to the downstream-side column member 122D; thus, it may be possible to construct the downstream-side column member 122D to have a narrow diameter.

It should be reminded that, although each of FIG. 7 and FIG. 8 shows the construction that the space between the overhung member 126U and the elastic member 145 is smaller than the space between the overhung member 126D and the elastic member 145, it is possible to adopt a construction opposite to the above construction, that is, the construction that the space between the overhung member 126D and the elastic member 145 is smaller than the space between the overhung member 126U and the elastic member 145, and the overhung member 126D at the side of the downstream-side column member 122D is first brought in contact with the arm 140 when the arm 140 is moved upward.

Third Embodiment

Figure 9:
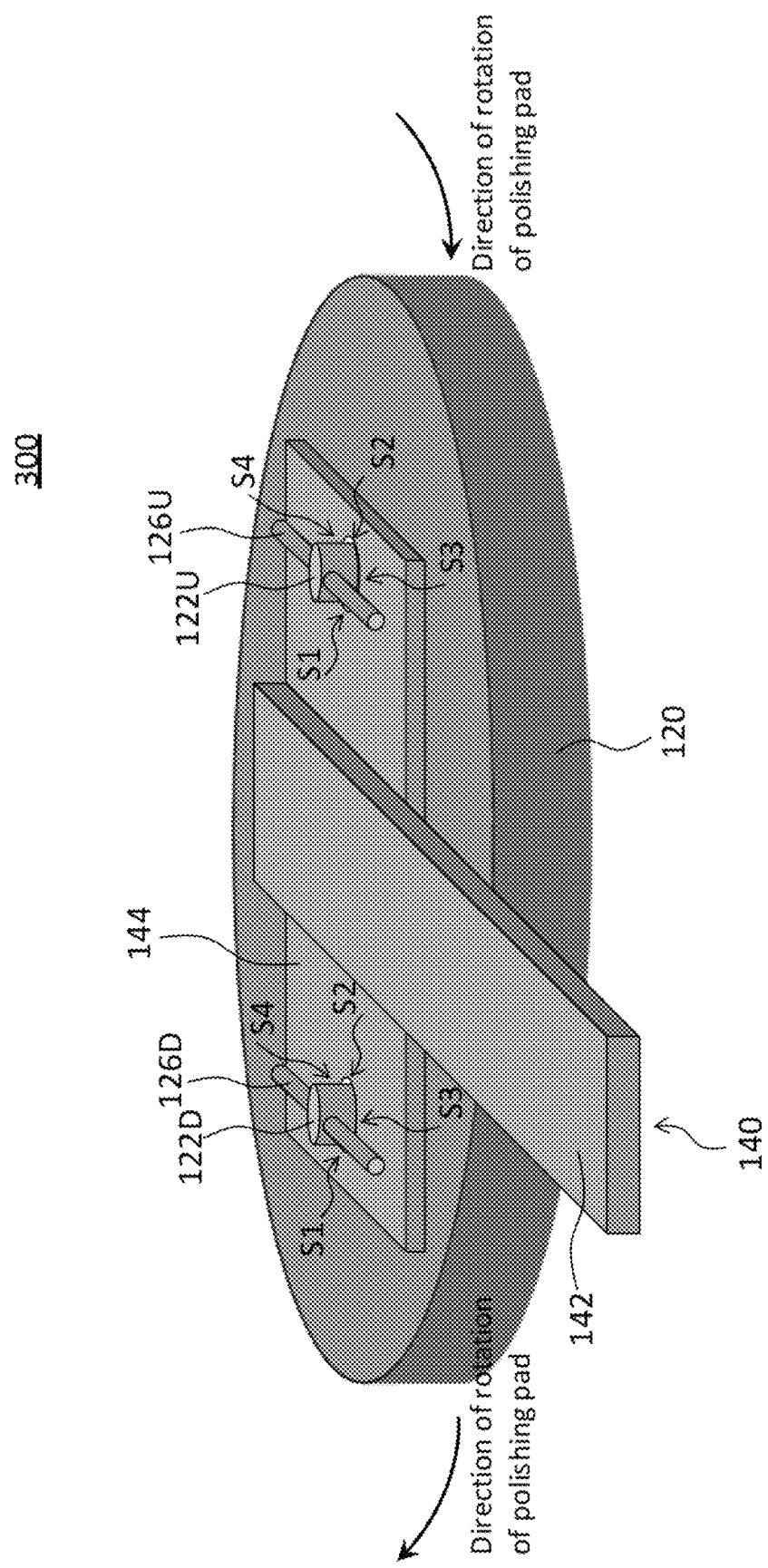
FIG. 9 is a perspective view showing a construction of a temperature adjusting device according to a third embodiment of the present invention.

FIG. 9 is a perspective view showing a construction of a temperature adjusting device 300 according to a third embodiment of the present invention. The temperature adjusting device 300 comprises a heat conductor 120, an arm 140, and an ascending/descending cylinder. In this regard, the ascending/descending cylinder is abbreviated in FIG. 9. The arm 140 comprises an arm base part 142 and an arm tip part 144. One end of the arm base part 142 is connected to the ascending/descending cylinder. The arm tip part 144 is attached to the other end of the arm base part 142. Through holes, in which an upstream-side column member 122U and a downstream-side column member 122D are to be inserted, are formed in the arm tip part 144.

The upstream-side column member 122U and the downstream-side column member 122D are formed in such a manner that they stand on the top face of the heat conductor 120. In the example shown in FIG. 9, one each of the upstream-side column member 122U and the downstream-side column member 122D are shown; however, it is possible to form two or more each of the upstream-side column members 122U and the downstream-side column members 122D. The upstream-side column member 122U and the downstream-side column member 122D are positioned in the through holes in the arm tip part 144, respectively. Further, the upstream-side column member 122U comprises a overhung member 126U which exists above the arm tip part 144 and extends in a direction that is horizontal and along the arm base part 142, and the downstream-side column member 122D comprises a overhung member 126D which exists above the arm tip part 144 and extends in a direction that is horizontal and along the arm base part 142.

In the arm tip part 144, elastic members (for example, resin), which are not shown in the figure, may be added to parts below the overhung members 126U and 126D. Further, bushes, which are made of resin, for example, may be arranged in the positions that are inside of the through holes in the arm tip part 144 and around the upstream-side column member 122U and the downstream-side column member 122D.

In the temperature adjusting device 300 constructed as explained above, when the arm 140 is moved downward to bring the heat conductor 120 in contact with the polishing pad 22, the overhung member 126U at the upstream-side and the overhung member 126D at the downstream-side are separated from the top face of the arm 140 (the arm tip part 144), and the arm 140 is also separated from the heat conductor 120. Accordingly, the heat conductor 120 is brought in contact with the surface of the polishing pad 22 by using the weight of the heat conductor 120 itself, i.e., without pushing the heat conductor 120 against the polishing pad 22 by excessive force applied by the arm 140. On the other hand, when the arm 140 is moved upward to pull the heat conductor 120 away from the polishing pad 22, the top face of the arm 140 (the arm tip part 144) is brought in contact with the overhung members 126U and 126D and the heat conductor 120 is lifted thereby.

Since the heat conductor 120 is put on the polishing pad 22 by use of the weight of heat conductor 120 itself, it becomes possible to prevent or suppress obstruction, by the heat conductor 120, of flow of a polishing fluid on the surface of the polishing pad 22. Accordingly, the polishing liquid is spread uniformly on the surface of the polishing pad 22, and, as a result, in-plane uniformity in polishing of the to-be-polished object, which is held by the top ring 24 and polished, can be improved. Further, for example, at the time of maintenance or the like, the heat conductor 120 can be lifted from the polishing pad 22, by moving the arm 140 upward by the ascending/descending cylinder 150. In the case that elastic members are added to the parts, which are brought in contact with the overhung members 126U and 126D when the heat conductor 120 is lifted, of the arm 140 (the arm tip part 144), impact at the time of contacting between the overhung members 126U and 126D and the arm 140 can be mitigated.

Similar to the case in the above-explained second embodiment, the overhung members 126U and 126D may be positioned in such a manner that a height from the top face of the heat conductor 120 to one of the overhung members 126U and 126D is different from that to the other of the overhung members 126U and 126D. For example, the height from the top face of the heat conductor 120 to the overhung member 126U may be lower than the height from the top face of the heat conductor 120 to the overhung member 126D. Similar to the case in the second embodiment, the heat conductor 120 can be tear off from the polishing pad 22 by applying relatively small force, by adopting the above constriction.

Further, relative movement between the heat conductor 120 and the arm 140 in a plane parallel to the polishing pad 22 is regulated to that within a predetermined range, as a result that the upstream-side column member 122U and the downstream-side column member 122D are brought in contact with wall surfaces of the through holes in the arm tip part 144. For example, when the heat conductor 120 attempts to move, with rotating operation of the polishing pad 22, in a direction that is the same as the direction of movement of the polishing pad 22 (that is, a left direction in FIG. 9, that is the direction toward the downstream side of rotation), the upstream-side column member 122U and the downstream-side column member 122D hit first side faces S1 (the faces facing the upstream side) which are parts of the wall surfaces of the through holes in the arm tip part 144. Thus, the heat conductor 120 cannot move further toward the downstream side.

Similarly, when the heat conductor 120 attempts to move toward the upstream side (a right direction in FIG. 9), the upstream-side column member 122U and the downstream-side column member 122D hit second side faces S2 (the faces facing the downstream side) which are parts of the wall surfaces of the through holes in the arm tip part 144, so that the heat conductor 120 cannot move further toward the upstream side. Further, when the heat conductor 120 attempts to move toward an outer periphery side of the polishing pad 22 (a near-side direction in FIG. 9), the upstream-side column member 122U and the downstream-side column member 122D hit third side faces S3 (the faces facing the center side of the polishing pad 22) which are parts of the wall surfaces of the through holes in the arm tip part 144, so that the heat conductor 120 cannot move further to approach the outer periphery of the polishing pad 22. Further, when the heat conductor 120 attempts to move toward the center side of the polishing pad 22 (a depth direction in FIG. 9), the upstream-side column member 122U and the downstream-side column member 122D hit fourth side faces S4 (the faces facing the outer periphery side of the polishing pad 22) which are parts of the wall surfaces of the through holes in the arm tip part 144, so that the heat conductor 120 cannot move further to approach the center of the polishing pad 22.

As explained above, the position of the heat conductor 120 on the polishing pad 22 can be maintained in a position near a predetermined position that is determined according to the position of the arm 140.

Fourth Embodiment

In each of the first, second, and third embodiments, the ascending/descending cylinder 150 may be constructed in such a manner that, when separating and lifting the heat conductor 120 from the polishing pad 22, the ascending/descending cylinder 150 slightly moves (in a side slipping manner) the heat conductor 120 in a horizontal direction and, thereafter, moves upward. For example, in the case that the heat conductor 120 is to be lifted from the polishing pad 22 when the polishing pad 22 is not rotated, large force is required to move the heat conductor 120 upward if attempt to move the heat conductor 120 upward in a simple manner is made; however, in the case that heat conductor 120 is slid in the direction parallel to the polishing pad 22 and lifted thereafter, a polishing liquid can enter, more easily, a space between the heat conductor 120 and the polishing pad 22, so that less force is required to tear off the heat conductor 120 from the polishing pad 22.

In the above description, embodiments of the present invention are explained based on some examples; and the above embodiments of the present invention are those used for facilitating understanding of the present invention, and are not those for limiting the present invention. It is obvious that the present invention can be changed or modified without departing from the scope of the gist thereof, and that the scope of the present invention includes equivalents thereof. Further, it is possible to arbitrarily combine components or omit a component (components) disclosed in the claims and the specification, within the scope that at least part of the above-stated problems can be solved and/or within the scope that at least part of advantageous effect can be obtained.

REFERENCE SIGNS LIST

10 Polishing device
20 Polishing table
22 Polishing pad
24 Top ring
26 Polishing liquid supplying nozzle
100 Temperature adjusting device
120 Heat conductor
122 Column member
122U Upstream-side column member
122D Downstream-side column member
126U, 126D Overhung member
140 Arm 142 Arm base part
144 Arm tip part
145 Elastic member
146 Guide part
150 Ascending/descending cylinder
200 Temperature adjusting device
300 Temperature adjusting device
R1 Axis of rotation of polishing table
R2 Axis of rotation of top ring
S1 First side face
S2 Second side face
S3 Third side face
S4 Fourth side face
W Semiconductor wafer

What is claimed is:

1. A temperature adjusting device for adjusting temperature of a rotating polishing pad, comprising:
    a heat conductor that can contact with a top face of the polishing pad;
    an arm for holding the heat conductor on or above the polishing pad, the arm comprising an arm base part and an arm tip part, the arm tip part comprising a top face part and one or more guide parts;
    a pair of upstream-side column members formed to stand on a top face of the heat conductor, the upstream-side column members arranged at a position at an upstream side of rotation of the polishing pad, each of the upstream-side column members positioned on an opposite side of the arm tip part;
    a pair of downstream-side column members formed to stand on the top face of the heat conductor, the downstream-side column members arranged at a position at a downstream side of rotation of the polishing pad, each of the downstream-side column members positioned on an opposite side of the arm tip part; and
overhung members extending, from the upstream-side column member and the downstream-side column members, in directions that are parallel to the top face of the heat conductor, wherein the overhung members can contact with the top face part of the arm tip part,
    wherein the upstream-side column members are contactable with one of a first side face and a second side face of a guide part of the one or more guide parts,
    wherein the downstream-side column members are contactable with the other of the first side face and the second side face of a guide part of the one or more guide parts,
    wherein the first side face is a face that is directed to the upstream side of the rotation, and
    wherein the second side face is a face that is directed to the downstream side of the rotation.

2. The temperature adjusting device according to claim 1, wherein, when the heat conductor is in contact with the polishing pad, the overhung members are separated from the top face part of the arm tip part.

3. The temperature adjusting device according to claim 2, wherein, when the top face part of the arm tip part is in contact with the overhung members, the heat conductor is separated from the polishing pad.

4. The temperature adjusting device according to claim 1, wherein
    one of the upstream-side column members and one of the downstream-side column members are contactable with a third side face of the top face part of the arm tip part,
    the other of the upstream-side column member and the downstream-side column member is contactable with a fourth side face of the top face part of the arm tip part,
    the third side face is a face that is directed to an inner periphery side in a radial direction in the polishing pad, and
    the fourth side face is a face that is directed to an outer periphery side in the radial direction in the polishing pad.

5. The temperature adjusting device according to claim 1, wherein the upstream-side column member and the downstream-side column members regulate relative movement between the heat conductor and the arm in a direction parallel to the top face of the heat conductor.

6. The temperature adjusting device according to claim 1, wherein the top face part of the arm tip part comprise an elastic material.

7. The temperature adjusting device according to claim 1, wherein a part of the arm, which is in contact with the upstream-side column member or the downstream-side column member, comprises an elastic member.

8. The temperature adjusting device according to claim 1, wherein the overhung member extends in a radial direction in the polishing pad.

9. The temperature adjusting device according to claim 1, wherein, when the heat conductor is in contact with the polishing pad, a size of a space in a height direction between the overhung member and the top face part of the arm tip part at the upstream-side column member is different from a size of a space in the height direction between the overhung member and the top face part of the arm tip part at the downstream-side column member.

10. The temperature adjusting device according to claim 9, wherein, when the heat conductor is in contact with the polishing pad, the size of the space in the height direction between the overhung member and the arm at the upstream-side column member is smaller than the size of the space in the height direction between the overhung member and the arm at the downstream-side column member.

11. The temperature adjusting device according to claim 10, wherein a diameter of the upstream-side column member is larger than a diameter of the downstream-side column member.

12. The temperature adjusting device according to claim 1, further comprising a movable mechanism for moving the heat conductor upward and downward.

13. The temperature adjusting device according to claim 12, wherein the movable mechanism can move the heat conductor in a horizontal direction.

14. A polishing device comprising:
    a polishing pad,
    a holding mechanism for holding a to-be-polished object on the polishing pad, and the temperature adjusting device according to claim 1.

* * * * *